United States Patent
Kemp et al.

(12) 
(10) Patent No.: US 10,522,018 B1
(45) Date of Patent: Dec. 31, 2019

(54) ENERGY PRODUCTION SYSTEM WITH INTELLIGENT INTRUSION DETECTION

(71) Applicant: IH IP Holdings Limited, St. Helier (JE)

(72) Inventors: Jason Wayne Kemp, Raleigh, NC (US); Lan Luo, Cary, NC (US)

(73) Assignee: IH IP Holdings Limited, St. Helier (JE)

( * ) Notice: Subject to any disclaimer, the term of this patent is extended or adjusted under 35 U.S.C. 154(b) by 95 days.

(21) Appl. No.: 15/793,929

(22) Filed: Oct. 25, 2017

Related U.S. Application Data (60) Provisional application No. 62/412,672, filed on Oct. 25, 2016.

(51) Int. Cl.
| | | |
|---|---|---|
| *G08B 13/24* | (2006.01) | |
| *G08B 13/12* | (2006.01) | |
| *G01R 31/28* | (2006.01) | |
| *G08B 25/10* | (2006.01) | |
| *G01R 22/06* | (2006.01) | |

(52) U.S. Cl.
CPC ....... *G08B 13/2494* (2013.01); *G01R 22/066* (2013.01); *G01R 31/2836* (2013.01); *G08B 13/128* (2013.01); *G08B 25/10* (2013.01)

(58) Field of Classification Search
CPC .............. G01R 22/066; G01R 31/2836; G08B 13/128; G08B 25/10

USPC ........................................................ 340/541
See application file for complete search history.

(56) References Cited

U.S. PATENT DOCUMENTS

| | | | | |
|---|---|---|---|---|
| 2005/0021188 | A1* | 1/2005 | Imhof .................... | H04L 41/22 700/276 |
| 2006/0176167 | A1* | 8/2006 | Dohrmann ........... | G08B 25/001 340/506 |
| 2007/0061125 | A1* | 3/2007 | Bhatt .................... | G06F 21/577 703/20 |
| 2013/0086376 | A1* | 4/2013 | Haynes ................. | G06F 21/577 713/155 |
| 2016/0092681 | A1* | 3/2016 | Valles ................... | G06F 21/554 726/23 |
| 2018/0048667 | A1* | 2/2018 | Tang .................... | H04L 41/142 |
| 2018/0364287 | A1* | 12/2018 | Sharp .................. | G01R 22/063 |
| 2019/0043339 | A1* | 2/2019 | Bernal ................. | G08B 25/00 |

* cited by examiner

*Primary Examiner* — Jack K Wang
(74) *Attorney, Agent, or Firm* — NK Patent Law (57) ABSTRACT

A system includes an energy production device, a tampering detection system comprising a plurality of sensors, and a control system in communication with the plurality of sensors. The control system is configured to detect a candidate for a tampering event, determine if the candidate is a tampering or a normal operational error by comparing a first order condition to a predetermined threshold, and, when the predetermined threshold is not met, comparing the candidate to a subsequent order condition until the threshold is met, and direct an undertaking of a countermeasure when the candidate is a determined tampering or undertaking a maintenance when the candidate is a determined normal operational error.

20 Claims, 7 Drawing Sheets

ENERGY PRODUCTION SYSTEM WITH INTELLIGENT INTRUSION DETECTION

CROSS-REFERENCE TO RELATED APPLICATIONS

This application claims priority to U.S. Provisional Patent Application No. 62/412,672 filed on Oct. 25, 2016 entitled INTELLIGENT INTRUSTION DETECTION, the contents of which are incorporated by reference herein.

BACKGROUND

Field of the Invention

Where energy production systems, such as so-called Low Energy Nuclear Radiation ("LENR") devices, are deployed in the field, normal and abnormal conditions occur. This spectrum of conditions also includes people employing technology and procedures to reverse-engineer, interrogate, or otherwise exploit advanced LENR devices. LENR devices have physical structures, electromagnetic systems, and are tracked with geographical positioning systems. There are existing technologies and procedures used to compromise and interrogate devices: electromagnetic systems, electrochemical properties, and physical devices. These include: magnetic resonance imaging, magnetic particle testing, electromagnetic source, thermal imaging, ultrasound, radiographic testing, backscattering, radio-frequency isolation, and UV-visible spectroscopy.

Car alarms are being made intelligent to differentiate between tampering (theft and vandalism) and routine activity (a shopping cart bumping into a car in parking lot). US Department of Defense identification cards, or "common access cards" (CAC) also have some ability to differentiate between tampering and routine errors. A University of Chicago paper, found at http://people.cs.uchicago.edu/~dinoysmartcard/security.html describes existing smart card technology.

Specific to smart cards, all data and passwords on a card are stored in the EEPROM and can be erased or modified by an unusual voltage supply. Therefore some security processors implemented sensors for environmental changes. However, since it is difficult to find the right level of sensitivity and there is a voltage fluctuation when the power is supplied to the card, this method is not widely used. Other successful attacks methods include heating the controller to a high temperature or focusing the UV light on the EEPROM, thus removing the security lock. Invasive physical attacks are the most destructive when the card is cut and processor removed. Then the layout of the chip can be reverse engineered.

Differential Power Analysis (DPA), is a statistical attack on a cryptographic algorithm which compares an hypothesis with a measured outcome and is often capable of extracting an encryption key from a smart card or other computing device. Simple Power Analysis (SPA), the direct analysis of the recorded power data to determine actions and data, is also useful.

Solutions

Several technologies have been developed to protect Smart Cards. These are technologies of STMicroelectronics against SPA/DPA attacks:

Technology barrier. Advanced 0.6 micron technology greatly reduces the size and power consumption of cards as well as the relative variations in their operating parameters. This makes it very hard for external SPA/DPA methods to distinguish between normal card fluctuations and data-related fluctuations.

Clock fluctuation. A special Clock Software Management facility, when properly used, results in highly variable software timing when the embedded application program is executing.

Unpredictable behavior. A built-in timer with Interrupt capability and an Unpredictable Number Generator is used to impose unpredictable variations on software execution behavior, with consequent changes in the pattern of power consumption.

Robust design. A modular design allows new hardware variations, including custom variations, to be produced quickly and efficiently, thereby allowing fast response to new attack scenarios.

Memory control for multi-applications. An enhanced Memory Access Control system provides secure operating system support for multi-application cards.

Security mechanisms and firmware functions. An enhanced set of security mechanisms and firmware functions allow the application to detect and respond appropriately to the occurrence of conditions that might indicate an attack. These conditions include invalid operating conditions, bad opcodes, bad addresses and violations of chip integrity; the possible responses include interrupts, program reset, immediate erasure of all RAM data and flash programming of the entire EEPROM array."

Current technologies use electro-optical cameras and a human eye to interpret these scientific measurements and thus determine the nature of a condition, assess the condition as threatening or routine, and take appropriate action. The technologies do not have a series of automation actions that help the device or system investigate the condition(s) and take the appropriate defensive or passive actions.

BRIEF SUMMARY

According to one embodiment of the present invention, a system includes an energy production device, a tampering detection system comprising a plurality of sensors, and a control system in communication with the plurality of sensors. The control system is configured to detect a candidate for a tampering event, determine if the candidate is a tampering or a normal operational error by comparing a first order condition to a predetermined threshold, and, when the predetermined threshold is not met, comparing the candidate to a subsequent order condition until the threshold is met, and direct an undertaking of a countermeasure when the candidate is a determined tampering or undertaking a maintenance when the candidate is a determined normal operational error.

According to one or more embodiments, the first order condition is based on data measured by a first sensor of the plurality of sensors.

According to one or more embodiments, subsequent order conditions are based on data measured by additional sensors of the plurality of sensors.

According to one or more embodiments, wherein the control system is configured to determine, based on additional data received at a subsequent time, that a determined tampering was an actual tampering or that a determined tampering was an actual normal operational error.

According to one or more embodiments, wherein the control system is configured to adjust the predetermined threshold based on the determined tampering being an actual tampering.

According to one or more embodiments, wherein the control system is configured to adjust the predetermined threshold based on the determined tampering being an actual normal operational error.

According to one or more embodiments, wherein the control system is configured to adjust the predetermined threshold based on the determined normal operational error being an actual normal operational error.

According to one or more embodiments, wherein the control system is configured to adjust the predetermined threshold based on the determined normal operational error being an actual tampering.

According to one or more embodiments, wherein undertaking a countermeasure when the candidate is a determined tampering is based on a comparison of the determined first order condition to the another threshold that is different than the threshold.

According to one or more embodiments, wherein the candidate is a detected break or discontinuity in an electrical signal surrounding the energy production device.

According to one or more embodiments, wherein the control system is configured to determine if there is a stoppage in current to the electrical signal from a primary external power source.

According to one or more embodiments, wherein the control system is configured to determine if there is a stoppage in current to the electrical signal from a secondary external power source.

According to one or more embodiments, wherein the control system is configured to determine if the primary external power source is reconnected within a predetermined period of time, and, when not reconnected during the predetermined period of time, direct the undertaking of the countermeasure.

According to one or more embodiments, a method includes detecting a candidate for a tampering event, determining if the candidate is a tampering or a normal operational error by comparing a first order condition to a predetermined threshold, and, when the predetermined threshold is not met, comparing the candidate to a subsequent order condition until the threshold is met, and directing an undertaking of a countermeasure when the candidate is a determined tampering, or undertaking a maintenance when the candidate is a determined normal operational error.

DETAILED DESCRIPTION

Designing an LENR device's protection system to detect and differentiate between tampering and normal operational error will employ a logic flow that drives the device's CPU to assess as many orders of data as necessary to determine whether the conditions warrant no action, maintenance actions, or self protective actions.

Figure 1:
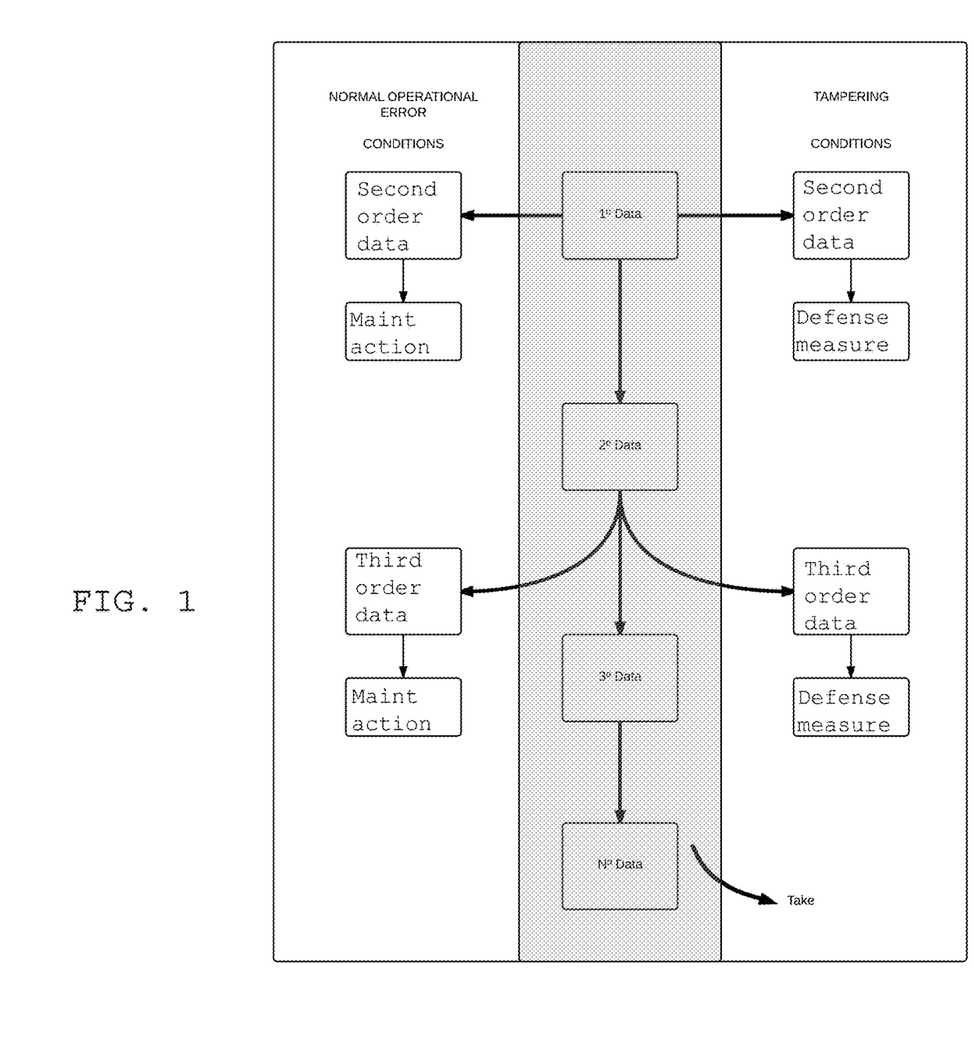
FIG. 1 is a conceptual logic flow chart of an exemplary reactor system.

FIG. 1 shows a conceptual logic flow. There are two overlapping sets of conditions: Normal Operational Error and Tampering. When the device detects a first order condition, the device will seek second order data that will lead the device to either take a maintenance action, take a defensive counter-measure, or perform an operation to retrieve the next order data. This process continues until the data collection process reaches a predetermined threshold (example, Nth degree), whereupon the device takes either a maintenance action or defensive counter-measure.

This process reflects a machine learning paradigm with labeled data (trainer network) created by expert-analyzed data exemplars. This trainer network performs "labeling" of data exemplars and builds a repository that the device utilizes to recognize data and conditions that result in a "smart" decision to either perform a maintenance or defensive action. Furthermore as greater data sets are collected, a deep neural network can be implemented refine decisions and actions. This logic flow applies to additional embodiments and logic flows, such as IVD IH-048 regarding leak detection.

Figure 2:
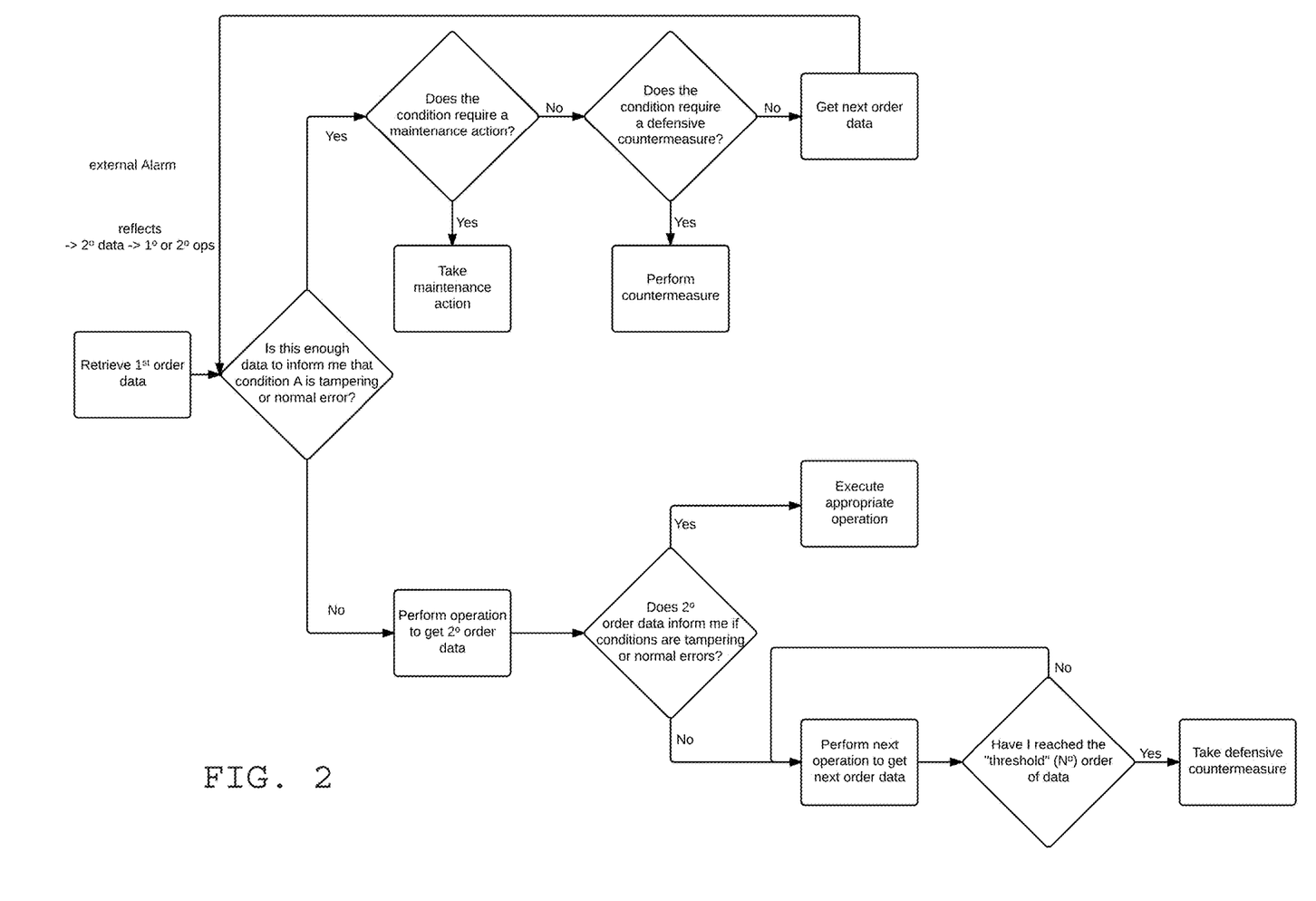
FIG. 2 is a logic flow chart of an exemplary smart alarm.

FIG. 2 shows the possible logic flow for the device or system's smart alarm, namely for any of the devices or systems disclosed herein. The device takes known data and performs operations to get more data. Each iteration of the 'perform specific operation to get specific data' will inform the device to either take a maintenance action, perform defensive counter-measure, or perform subsequent operation to get the next order of data. The device will eventually perform a maintenance action or a defensive countermeasure, such as entering self-protect mode.

Figure 3:
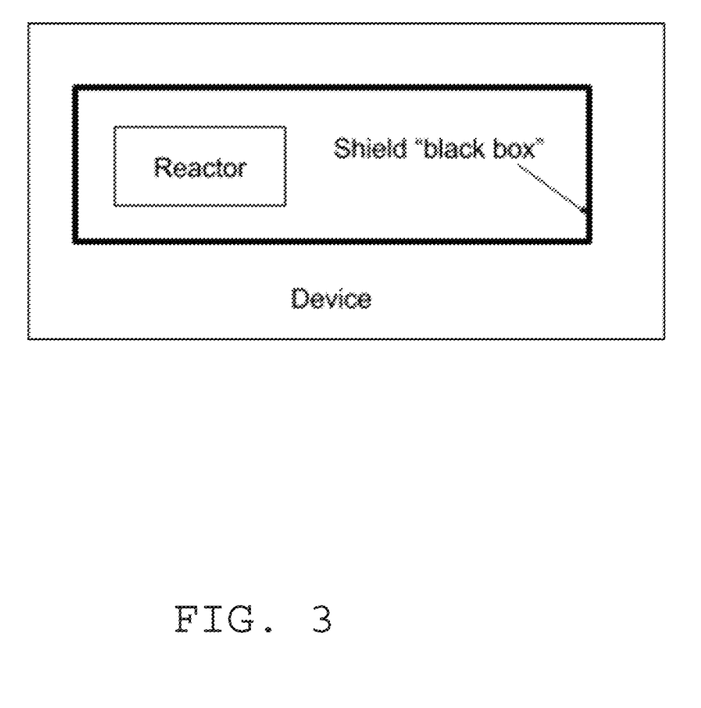
FIGS. 3 and 4 illustrate possible positions where an anti-intrusion shield can be placed.
Figure 4:
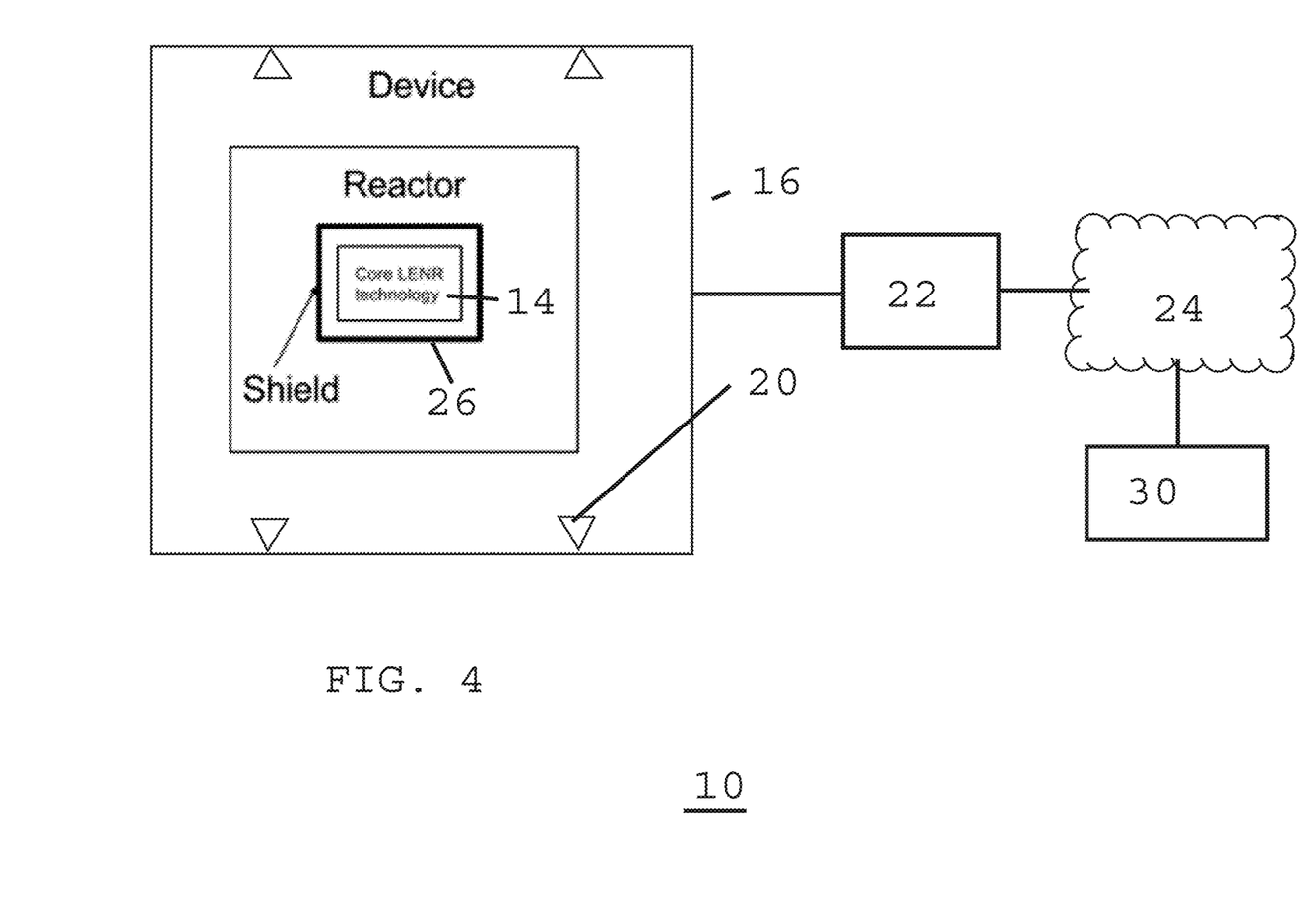
Figure 5:
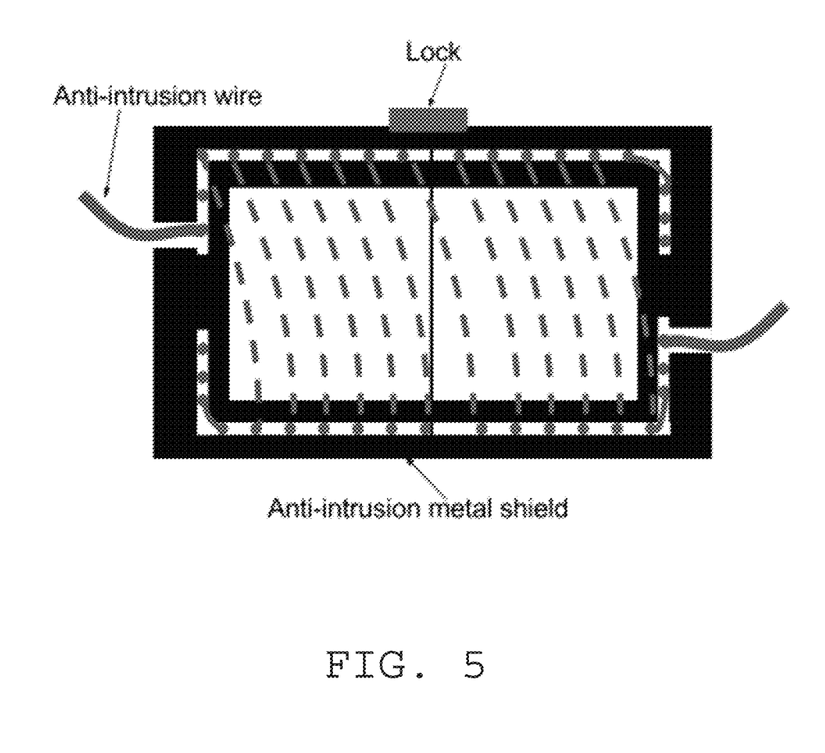
FIG. 5 illustrates an exemplary design of an anti-intrusion metal shield.

FIGS. 3 and 4 show the possible position of the anti-intrusion shield in the device: the shield can cover either the entire device, or only the core part. The shield is made of stainless steel. The shield is hollow and has two parts, and when assembled, the two parts are attached together with an electronic lock with password, so the entire shield becomes a close system, as shown in FIG. 5.

A system 10 is thus illustrated and provided in FIG. 4. The system 10 includes an energy production device 14. The energy production device 14 may include an LENR technology, which is a type of technology that can be susceptible to fluctuations in temperature, heat gradients, and the like. Because of these fluctuations, monitoring for a tampering or maintenance event can be problematic because of the noise and uncertainty associated with these external forces.

A tampering detection system 16 includes a plurality of sensors 20. The sensors 20 may be disparate or integrated, or may be similar or different. The sensors 20 may be, for example, an imaging device such as a black and white or grayscale camera, color camera, infrared camera, and the like. The sensors 20 may be temperature sensors, either integrated on the energy production device 14, or spaced-apart from the device 14 to determine an area gradient. The sensors 20 may be vibratory sensors configured to detect vibration of the energy production device 14, or vibration proximal to the energy production device 14, where such vibration may be indicative of entry of a person. The sensors 20 may be optical in nature for detecting movement of an entrant. Additional sensors may be employed, such as barometric, atmospheric, and the like. Additional sensors may detect the presence of extraneous ferrous materials, such as tools, that could be used by a maintenance person or an unauthorized entrant. In this particular entrance where an electromagnetic sensor, for example, would detect a wrench held by an authorized maintenance person and a crow bar held but an unauthorized entrant, additional sensors and the control system that will be described further herein may be used to determine which is a maintenance event and which is a tampering event.

A control system 22 is in communication with the plurality of sensors 20. The control system 22 may be integrated or disparate across many proxied or disjointed components. The control system 22 may include a memory and a processor, and is configured to detect a candidate for an tampering event. The candidate for a tampering event may be determined or detected based on the measurements from the sensors. For example, indication of abnormal vibration from a vibratory sensor may be indicative of an entrant. Coupled with an increase in air temperature as read by a thermometer may signal that a person is in one particular location proximal to the thermometer. A wireless network or other network 24 may allow for communications with any of the devices and components disclosed herein, including notification module 26.

As used herein, first order may mean a first line of sensors, for example, a sensor that detects a break in an electrical current. Or the first order may mean the temperature sensors. Or first order may mean raw data that has not been further processed for things like gradient, time of day, and the like. Second order may mean the imaging or video sensors, or may mean manipulation and integration of data across a plurality of disparate sensors, such as imaging and thermal sensors. Or second order may mean a further manipulation of the data, such as a derivate or integration of data. Subsequent orders will go through further refinements.

The control system is configured to determine if the candidate is a tampering or a normal operational error by comparing a first order condition to a predetermined threshold, and, when the predetermined threshold is not met, comparing the candidate to a subsequent order condition until the threshold is met. The threshold may be a statistical degree of certainty, for example, or may be variable depending on the type of sensor to which the first order data comes from. For example, a detected break in electrical current may require a lesser degree of statistical certainty because this is normally an absolute event that is associated with tampering. Alternatively, an increase in temperature may require a greater degree of certainty because of the normal, to be expected, fluctuations in temperature of an energy production device. The degree of certainty may also be adjusted based on the number of sensors, their disparity, and the like.

The control system may be configured to direct an undertaking of a countermeasure when the candidate is a determined tampering, or undertaking a maintenance event when the candidate is a determined normal operational error. The countermeasure may be alerting authorities, dispatching security, enabling additional sensors, shutting down or ceasing operations for the energy production device and the like when the candidate is a determined tampering. The control system may be configured to direct a maintenance event such as dispatching a maintenance person, adding cooling fluids to the energy production device, shutting down or modifying operation of the energy production device, and the like.

The control system may be configured to determine, based on additional data received at a subsequent time, that a determined tampering was an actual tampering or that a determined tampering was an actual normal operational error. The control system may be configured to adjust the predetermined threshold based on the determined tampering being an actual tampering. The control system may be configured to adjust the predetermined threshold based on the determined tampering being an actual normal operational error. The control system may be configured to adjust the predetermined threshold based on the determined normal operational error being an actual normal operational error. The control system may be configured to adjust the predetermined threshold based on the determined normal operational error being an actual tampering. Undertaking a countermeasure when the candidate is a determined tampering is based on a comparison of the determined first order condition to the another threshold that is different than the threshold.

Figure 7:
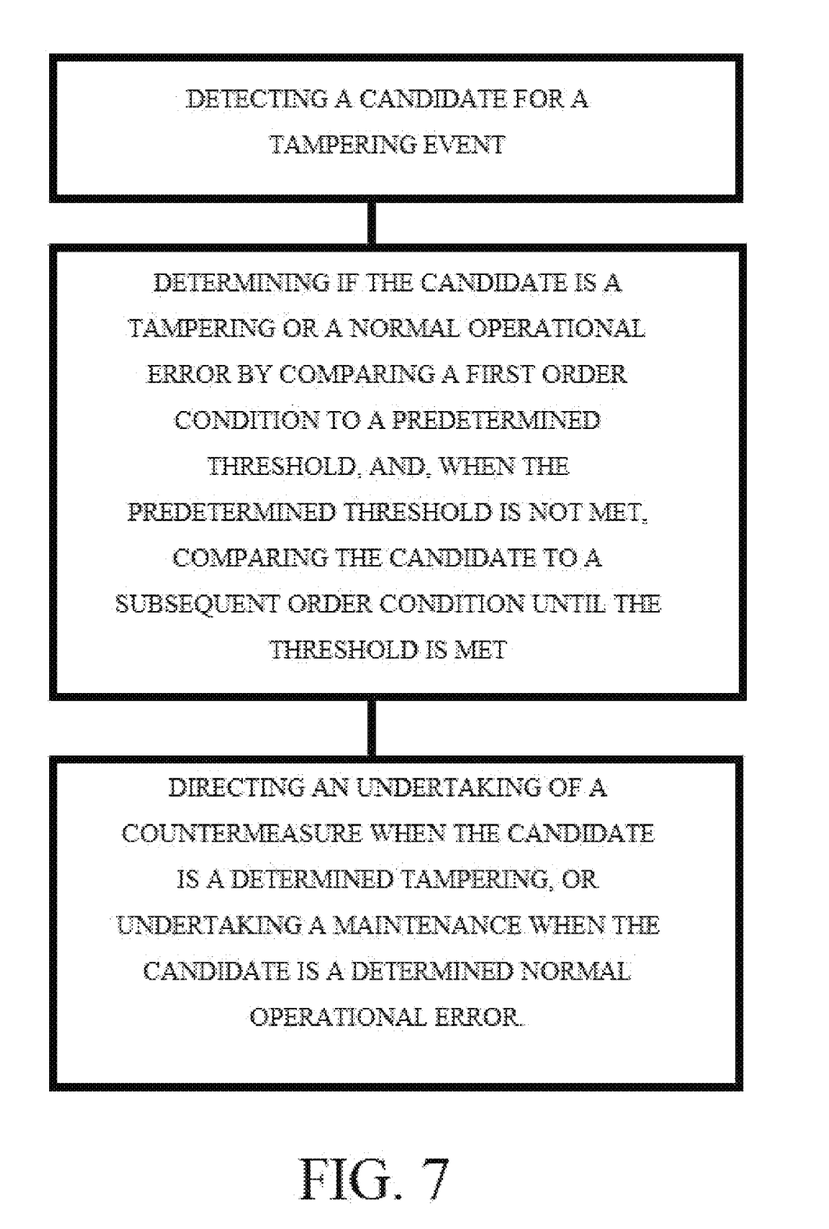
FIG. 7 illustrates a flow chart describing one or more methods disclosed herein.

A method is thus illustrated in FIG. 7. The method includes detecting a candidate for a tampering event, determining if the candidate is a tampering or a normal operational error by comparing a first order condition to a predetermined threshold, and, when the predetermined threshold is not met, comparing the candidate to a subsequent order condition until the threshold is met, and, directing an undertaking of a countermeasure when the candidate is a determined tampering, or undertaking a maintenance when the candidate is a determined normal operational error.

Figure 6:
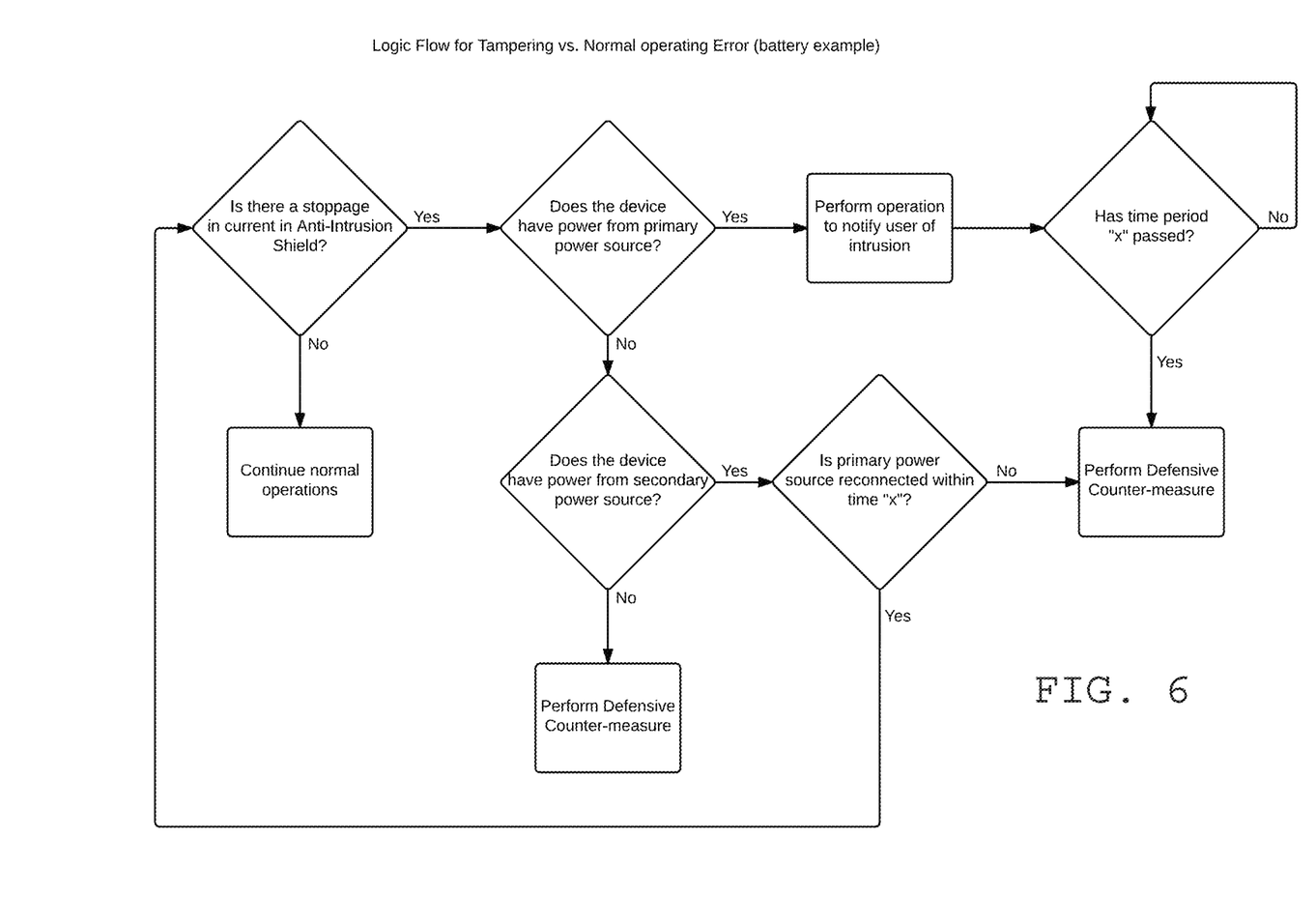
FIG. 6 illustrates a logic flow for detecting the nature of an intrusion.

As illustrated in FIG. 6, the logic flow for determining an intrusion in the anti-intrusion metal shield. In some embodiments, an anti-intrusion metal shield has an electric current flowing. This example discusses an example where the device decides whether this stoppage of electric current is due to normal operational error or tampering.

1. Is there a stoppage in current in the anti-intrusion shield?
   a. No. The device continues normal operations.
   b. Yes. Does the device have power from the primary power source?
      i. If Yes. The device should notify the user of an intrusion. The device does not yet know if the intrusion is due to a routine operating error (a maintenance problem) or tampering (a malicious or destructive act). The device then asks the following question:
         (1) Has a set time period "x" passed?
            (a) If no, ask the question again until the anti-intrusion field has current again or "x" time passes.
            (b) If yes, the device performs a defensive counter
   (1) If no, then the device can assume that an external actor has disabled all the power sources and is attempting to tamper with the device. The device then performs a defensive counter-measure.
      (2) If yes, the device notifies the user that there is no power to the anti-intrusion field and that the primary power source does not have power. The device must perform an operation to the get order of data to determine if the condition is within normal operating error or due to tampering. Is the primary power source re-connected within a set time period "x"?
         (a) If yes, then the device performs an operation to ask if there is a stoppage in current in the anti-intrusion shield (step 1).
         (b) If no, then the device can assume that the conditions are not due to normal operational error (which would have been addressed with a maintenance action). The device will assume tampering and perform a defensive counter measure.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   an energy production device;
   a tampering detection system comprising a plurality of sensors; and
   a control system in communication with the plurality of sensors and configured to:

detect a candidate for a tampering event, wherein the candidate is a detected break or discontinuity in an electrical signal surrounding the energy production device;

determine if there is a stoppage in current to the electrical signal from a primary external power source;

determine if the primary external power source is reconnected within a predetermined period of time, and, when not reconnected during the predetermined period of time, direct the undertaking of a countermeasure;

determine if the candidate is a tampering or a normal operational error by comparing a first order condition to a predetermined threshold, and, when the predetermined threshold is not met, comparing the candidate to a subsequent order condition until a threshold is met; and direct an undertaking of the countermeasure when the candidate is a determined tampering or undertaking a maintenance when the candidate is a determined normal operational error.

2. The system of claim 1, wherein the first order condition is based on data measured by a first sensor of the plurality of sensors.

3. The system of claim 2, wherein subsequent order conditions are based on data measured by additional sensors of the plurality of sensors.

4. The system of claim 1, wherein the control system is configured to determine, based on additional data received at a subsequent time, that a determined tampering was an actual tampering or that a determined tampering was an actual normal operational error.

5. The system of claim 4, wherein the control system is configured to adjust the predetermined threshold based on the determined tampering being an actual tampering.

6. The system of claim 4, wherein the control system is configured to adjust the predetermined threshold based on the determined tampering being an actual normal operational error.

7. The system of claim 4, wherein the control system is configured to adjust the predetermined threshold based on the determined normal operational error being an actual normal operational error.

8. The system of claim 4, wherein the control system is configured to adjust the predetermined threshold based on the determined normal operational error being an actual tampering.

9. The system of claim 4, wherein undertaking a countermeasure when the candidate is a determined tampering is based on a comparison of the first order condition to another threshold that is different than the threshold.

10. The system of claim 1, wherein the control system is configured to determine if there is a stoppage in current to the electrical signal from a secondary external power source.

11. A method comprising:

detecting a candidate for a tampering event, wherein the candidate is a detected break or discontinuity in an electrical signal surrounding an energy production device;

determining if there is a stoppage in current to the electrical signal from a primary external power source;

determining if the primary external power source is reconnected within a predetermined period of time, and, when not reconnected during the predetermined period of time, direct the undertaking of a countermeasure;

determining if the candidate is a tampering or a normal operational error by comparing a first order condition to a predetermined threshold, and, when the predetermined threshold is not met, comparing the candidate to a subsequent order condition until a threshold is met; and directing an undertaking of the countermeasure when the candidate is a determined tampering, or undertaking a maintenance when the candidate is a determined normal operational error.

12. The method of claim 11, wherein the first order condition is based on data measured by a first sensor of a plurality of sensors.

13. The method of claim 12, wherein subsequent order conditions are based on data measured by additional sensors of the plurality of sensors of a tampering detection system.

14. The method of claim 11, determining, based on additional data received at a subsequent time, that a determined tampering was an actual tampering or that a determined tampering was an actual normal operational error.

15. The method of claim 14, adjusting the predetermined threshold based on the determined tampering being an actual tampering.

16. The method of claim 14, adjusting the predetermined threshold based on the determined tampering being an actual normal operational error.

17. The method of claim 14, adjusting the predetermined threshold based on the determined normal operational error being an actual normal operational error.

18. The method of claim 14, adjusting the predetermined threshold based on the determined normal operational error being an actual tampering.

19. The method of claim 14, wherein directing an undertaking of a countermeasure when the candidate is a determined tampering is based on a comparison of the first order condition to another threshold that is different than the threshold.

20. A non-transitory computer-readable storage medium, the non-transitory computer-readable storage medium storing instructions to be implemented on a control system including at least one processor, the control system having communication with a plurality of sensors monitoring an energy production device, the instructions when executed by the at least one processor cause the control system to perform a method for detecting tampering of the energy production device, the method comprising:

detecting a candidate for a tampering event, wherein the candidate is a detected break or discontinuity in an electrical signal surrounding an energy production device;

determining if there is a stoppage in current to the electrical signal from a primary external power source;

determining if the primary external power source is reconnected within a predetermined period of time, and, when not reconnected during the predetermined period of time, direct the undertaking of a countermeasure;

determining if the candidate is a tampering or a normal operational error by comparing a first order condition to a predetermined threshold, and, when the predetermined threshold is not met, comparing the candidate to a subsequent order condition until a threshold is met; and directing an undertaking of the countermeasure when the candidate is a determined tampering, or undertaking a maintenance when the candidate is a determined normal operational error.

* * * * *